United States Patent [19]
Palmer

[11] Patent Number: 5,463,356
[45] Date of Patent: Oct. 31, 1995

[54] FM BAND MULTIPLE SIGNAL MODULATOR

[76] Inventor: James K. Palmer, 134 Fel Mar Dr., San Luis Obispo, Calif. 93405

[21] Appl. No.: 188,025

[22] Filed: Jan. 28, 1994

[51] Int. Cl.$^6$ .............................. H03C 3/00; H04B 7/00; H04B 7/12
[52] U.S. Cl. .................. 332/117; 332/119; 327/119; 331/37; 455/59; 455/112
[58] Field of Search ................. 332/117, 119–122, 332/151–154; 455/17, 49.1, 59, 91, 102, 103, 110–113, 118; 327/119; 331/37–43

[56] References Cited

U.S. PATENT DOCUMENTS 3,541,266  11/1970  Klayman et al. ............... 327/119 X
3,739,283   6/1973  Colligan ......................... 325/373
3,806,811   4/1974  Thompson ..................... 327/119 X Primary Examiner—David Mis
Attorney, Agent, or Firm—Daniel C. McKown

[57] ABSTRACT

Apparatus and a method for generating all of the assignable carrier frequencies in the FM broadcast band and for frequency modulating the generated carriers includes a generator of a train of pulses having a crystal-controlled repetition frequency and a specific pulse shape which together produce a spectrum of odd harmonics of the pulse repetition frequency whose separation in frequency is identical to that of the assignable carrier frequencies. This pulse train is then mixed with a 98.0 MHz sine wave to translate the spectrum to the FM band. Simultaneous modulation of all the carriers is achieved by frequency modulating the 98.0 MHz sine wave, whereby the same modulation is imparted simultaneously to all of the carriers.

29 Claims, 2 Drawing Sheets 5,463,356

FM BAND MULTIPLE SIGNAL MODULATOR

BACKGROUND OF THE INVENTION

1. Field of the Invention

The present invention is in the field of radio and specifically relates to apparatus and a method for simultaneously generating a set of carriers having all of the possible station frequencies within the frequency modulation (FM) broadcast band and for simultaneously modulating all of the carriers with an audio, video, or digital signal.

2. Background and Prior Art

In the United States, the FM broadcast band is approximately 20 MHz wide, and extends from approximately 88.0 MHz to approximately 108.0 MHz. Assignable station frequencies are spaced uniformly across this band and are separated by 200 KHz at the so called "odd frequencies" such as 90.1, 90.3, 90.5 MHz, etc. A significant aspect of the present invention is the simultaneous generation of all of these frequencies with relatively simple apparatus.

In the United States, to prevent interference, the frequencies in any particular geographical area are allocated by the Federal Communications Commission from among the assignable frequencies in the FM broadcast band.

The present invention could be used in providing an emergency message that can be detected by an ordinary FM receiver regardless of which station the receiver may be tuned to. The circuit of the present invention could also be used to provide digital transmission over a wide band, thereby making jamming or interference difficult. In yet another application, the circuit of the present invention could be used in television or microwave repeaters where there is a need for keeping a particular modulation while changing the carrier frequency to avoid feedback.

In principle, the purpose of the present invention could be accomplished by providing approximately 100 oscillators, each operating at one of the assignable frequencies, and by frequency modulating the oscillators with a common modulation signal. However, this approach is undesirable because of the large physical space required and because of the cost. The present inventor has found a simpler and better way of achieving the desired result.

SUMMARY OF THE INVENTION

It is an object of the present invention to provide apparatus and a method for generating a set of carriers corresponding to all of the assignable frequencies in the FM broadcast band, and for applying a modulation signal to all of the carriers.

In accordance with the present invention, there is produced a train of pulses having a crystal-controlled pulse repetition frequency of 100 KHz, with each pulse having a rise time of less than 50 nanoseconds and having a pulse width of exactly 5 microseconds. The duty cycle of each pulse is 50 percent. The spectrum of such a pulse train consists of an evenly-spaced set of harmonics spaced 200 KHz apart and extending to frequencies as high as 10 MHz. The pulse train is then applied to a mixer where it is mixed with a 98.0 MHz sine wave; 98.0 MHz is the center frequency of the FM band. Because the spectrum of the pulse train contains only odd harmonics, the spectrum of the output of the mixer consists of the frequencies defined by 98.0±N 10 MHz where N is an odd integer. These spectral components will be recognized as being identical to the set of assignable frequencies in the FM broadcast band.

The output of the mixer is then cleaned up to eliminate any 98.0 MHz component that may be present in the mixer output, to confine the spectrum to the FM band, and to equalize the amplitudes of the spectral components.

If it is desired to impress a single modulating signal onto all of the carriers, that can be accomplished by altering the frequency of the 98.0 MHz input to the mixer; i.e., essentially frequency modulating the 98.0 MHz input by the modulating signal that is to be impressed on all of the carriers.

Alternatively, depending on the application, it may be desirable to electronically select only a subset of the carriers and to subject them to a common modulation or to modulate them individually to different modulating signals.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

DETAILED DESCRIPTION OF THE PREFERRED EMBODIMENT

The design strategy behind the present invention is first to generate a highly controlled pulse train, the spectrum of which includes only odd harmonics that are separated in frequency by the same spacing (200 KHz) as the assignable frequencies of the FM broadcast band. However, the width of the band occupied by these frequency components is only 10 MHz wide and is centered about zero.

This distribution of components is then shifted into the FM broadcast band by multiplying the pulse train of the components by a 98.0 MHz sinusoidal signal in a mixer. Because the mixer produces the sum and difference frequencies of the applied signals, the spectrum of the output of the mixer consists of components located at frequencies of 98.0 MHz±100 KHz, 98.0 MHz±300 KHz, 98.0 MHz±500 KHz, etc. These frequencies are exactly the frequencies of the assignable carriers in the FM band.

Thereafter, the output of the mixer can be cleaned-up by limiting the output to the FM band by means of a bandpass filter, by equalizing the components by means of a compander, and by applying a notch filter to eliminate any components at 98.0 MHz that may have gotten through the mixer.

On each of the carriers thus generated a modulating signal can be simultaneously impressed by using the desired modulating signal to frequency modulate the 98.0 MHz oscillator before its output is applied to the mixer. The apparatus used to implement this design strategy or method will be described in greater detail in connection with the block diagram of FIG. 1.

Figure 1:
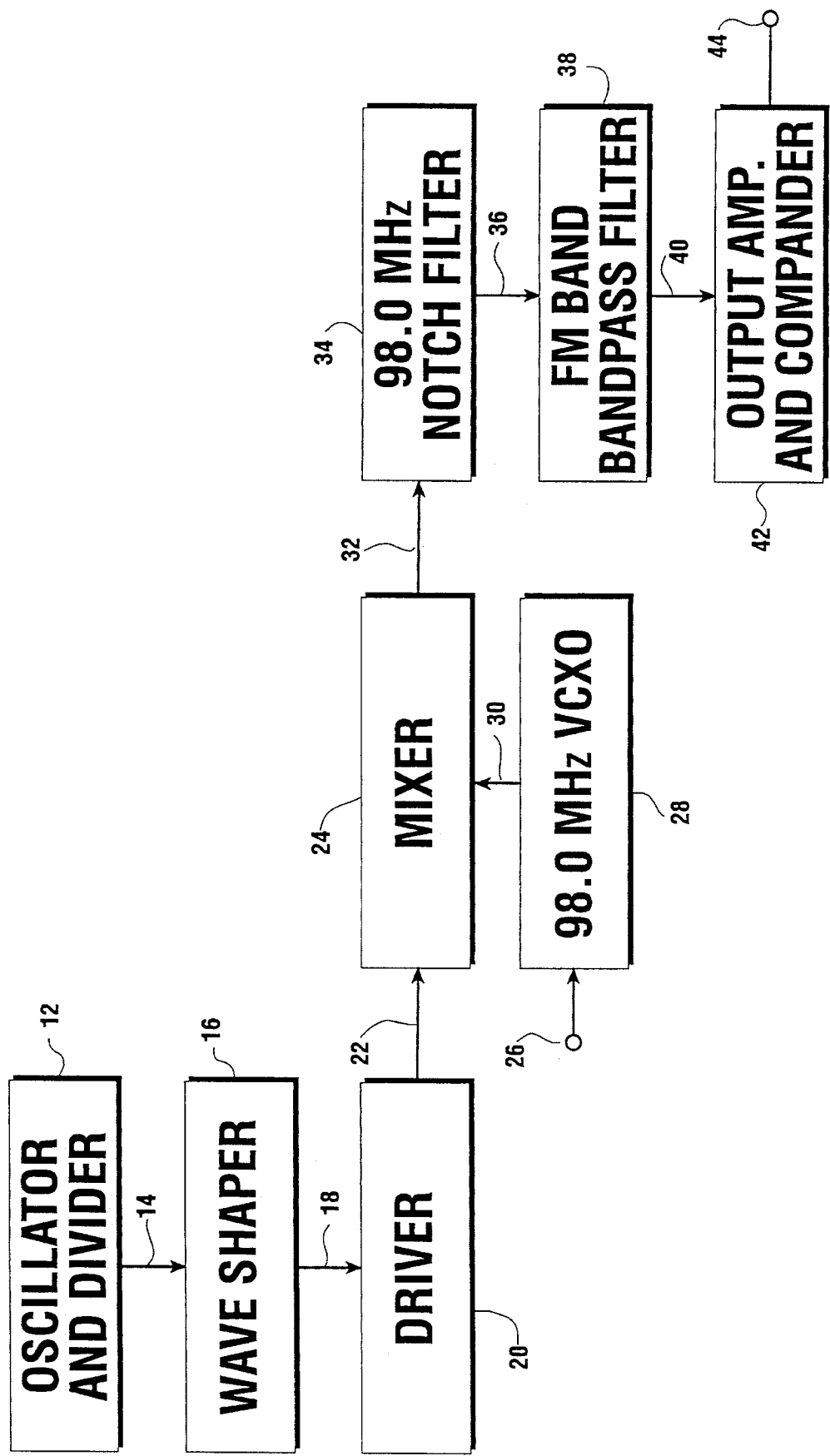
FIG. 1 is an electronic block diagram showing the circuit used in a preferred embodiment of the present invention.

FIG. 1 shows a block diagram of the entire system in a preferred embodiment of the present invention.

Figure 2:
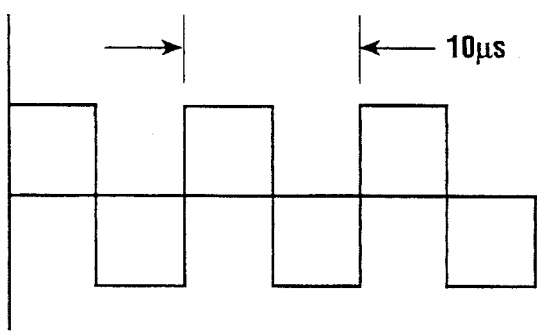
FIG. 2 is a graph showing the signal at the output of the oscillator and divider in the circuit of FIG. 1.

The purpose of the oscillator and divider 12 is to provide on the conductor 14 a train of timing pulses having an accurately controlled pulse repetition frequency of 100 KHz. In the preferred embodiment this is accomplished by using a crystal-controlled oscillator having a frequency of 1 MHz and by counting down by a factor of 10. In an alternative embodiment a 100 KHz crystal is used, but the 1 MHz crystal used in the preferred embodiment is significantly lower in cost and has better stability. The timing signal on the conductor 14, shown in the graph of FIG. 2, is applied to the wave shaper 16. In the preferred embodiment, the train of timing pulses on the conductor 14 is a square wave with a rise time of 1 ns and a fall time of 2 ns. Output voltage is 3.25 V peak-to-peak.

In an alternative embodiment, instead of using the oscillator and divider 12 and the wave shaper 16 to generate a pulse train having the desired characteristics, a phase-locked oscillator that produces the desired wave shape may be locked to the timing signals produced by a crystal oscillator.

In the preferred embodiment the wave shaper circuit 16 includes a monostable multivibrator. The RC time constant for the wave shaper should be set so the rise time of the pulse is less than 50 ns and the pulse width is exactly 5 microseconds.

With the pulses thus shaped, all of the even order harmonics are reduced to a level 35 db below the peak output of the odd order harmonics. The rise time of the pulse determines the bandwidth of the output spectrum. The rise time of less than 50 ns produces a spectrum of evenly spaced harmonics that extend to 10 MHz with less than 2 db roll-off from the low frequency end of the spectrum. This level of roll-off is considered to be the maximum permissible when also generating a counterpart of the FM commercial broadcast band.

Figure 3:
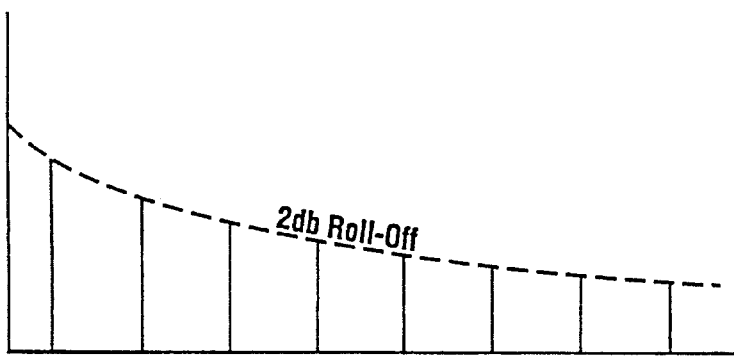
FIG. 3 is a graph showing the spectrum of the output of the driver in FIG. 1.

The carefully shaped train of pulses on the conductor 18 is applied to the driver 20. The driver 20 is a buffer amplifier having a low impedance output, which is required by the mixer 24. FIG. 3 is a graph showing the spectrum of the signal applied on conductor 22 to the mixer 24.

Figure 4:
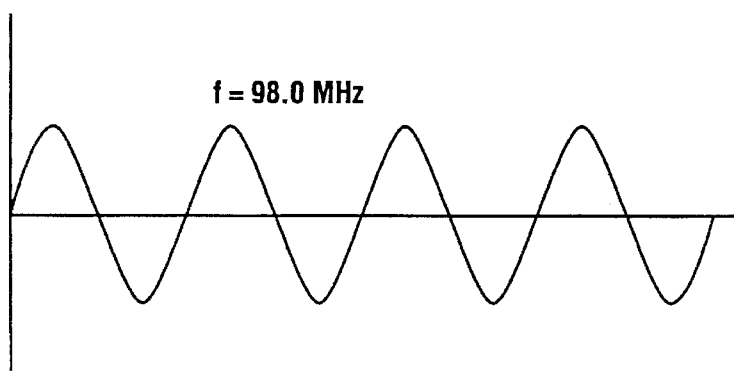
FIG. 4 is a graph showing the signal at the output of the 98.0 MHz oscillator of FIG. 1.

The mixer 24 has the effect of multiplying the signals on the conductors 22 and 30, and it will be recalled that the spectrum of the multiplied signals ideally consists of components having the sum and the difference of the combined frequencies. Thus, when the signal on the conductor 30 is a sinusoidal wave having a frequency of 98.0 MHz, as shown in FIG. 4, the spectrum of the output of the mixer 24 will consists of the frequencies 98.0 MHz±100 KHz, 98.0 MHz ±300 KHz, 98.0 MHz±500 KHz, etc. These components correspond exactly to the set of assignable frequencies in the FM broadcast band.

In practice a certain amount of 98.0 MHz signal also gets through the mixer 24, but that undesirable component is eliminated by applying the output of the mixer 24 on the conductor 32 to the 98.0 MHz notch filter 34.

Also, the signal on the conductor 32 may include frequency components that lie outside the FM band, and those components are eliminated by applying the output of the notch filter 34 on the conductor 36 to the FM band bandpass filter 38.

Figure 5:
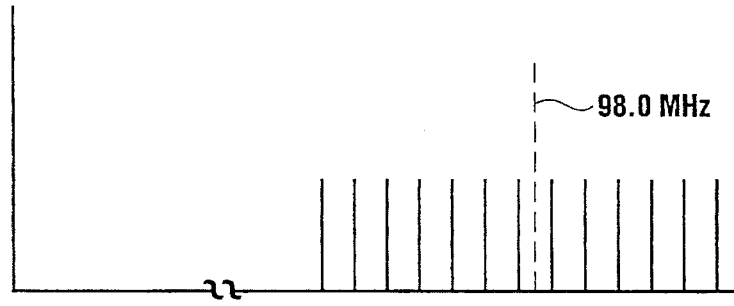
FIG. 5 is a graph showing the spectral components of the output of the circuit of FIG. 1.

Also, as mentioned above in connection with FIG. 3, the frequency components may roll off with increasing spacing from the center frequency (98.0 MHz) of the band, and in the preferred embodiment this roll-off is corrected by applying the output of the FM band bandpass filter 38 on the conductor 40 to the output amplifier and compander 42. The spectrum of the resulting output signal at the terminal 44 is shown in FIG. 5.

To this point it has been shown that the circuit of FIG. 1 is capable of simultaneously producing all of the assignable carriers in the FM broadcast band. This is a useful achievement in that it permits access by radio to all of the FM receivers within range, regardless of which station they are tuned to. However, if a meaningful signal is to be transmitted to the receivers, the transmitted carriers must be frequency modulated. This is accomplished in the preferred embodiment by use of the voltage controlled crystal oscillator (VCXO) 28. When no modulating signal is applied to the terminal 26, the output of VCXO 28 on line 30 is the sinusoidal wave shown in FIG. 4. A crystal in the VCXO 28 controls the frequency accurately at 98.0 MHz. However, the frequency of the signal on the conductor 30 can be swept by the application of a modulating signal to the terminal 26. The signal on the conductor 30 is thus frequency modulated by the signal applied to the terminal 26, and this signal may be an audio signal, a video signal, or a digital signal, depending on the application. Each of the frequency components on the conductor 22 is frequency modulated by the signal applied to the terminal 26. In this way, the message applied to the terminal 26 can be transmitted to all of the FM receivers in the area regardless of which station they are tuned to.

Thus, there has been described an apparatus and method for simultaneously generating a set of carriers having all of the assignable frequencies within the FM broadcast band, and for simultaneously modulating all of the carriers with an audio, video, or digital signal.

The preceding description has dealt with a way of simultaneously frequency-modulating the set of carriers. Workers in the art will recognize that the present invention is also applicable to simultaneously phase-modulating the set of carriers. It is well-known that frequency modulation and phase modulation are alternative descriptive terms for the same phenomenon, and that the variation in frequency is determined solely by the rate of change of phase.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. Apparatus for generating a set of carriers that are equally spaced in frequency across a band, comprising in combination:

first means for generating a waveform that has a spectrum which consists substantially of only odd integer multiples of a frequency equal to half the spacing between the carriers in the band;

second means for generating a sinusoidal signal having a frequency equal to the center frequency of the band;

a mixer having a first input terminal connected to said first means for receiving the waveform, having a second input terminal connected to said second means for receiving the sinusoidal signal, and having an output terminal, said mixer producing in response to the waveform and to the sinusoidal signal an output signal that includes the set of carriers on said output terminal.

2. The apparatus of claim 1 further comprising in combination filter means connected to the output terminal of said mixer for removing unwanted spectral components from the output signal of said mixer.

3. The apparatus of claim 1 wherein said waveform is a continuing train of pulses.

4. The apparatus of claim 1 wherein said first means further comprise in combination:

a crystal-controlled oscillator generating a train of timing pulses; and, a wave shaper connected to said crystal-controlled oscillator and producing the waveform under control of the train of timing pulses.

5. The apparatus of claim 4 wherein said wave shaper further comprises a monostable multivibrator.

6. The apparatus of claim 4 wherein said wave shaper further comprises a phased-locked oscillator.

7. A method of generating a set of carriers that are equally spaced in frequency across a band, comprising the steps of:

a) generating a waveform that has a spectrum which consists substantially of only odd integer multiples of a frequency equal to half the spacing between the carriers in the band;

b) applying the waveform as a first input to a mixer; and, c) applying as a second input to the mixer a sinusoidal signal having a frequency equal to the center frequency of the band, whereby the set of carriers is present in the output signal of the mixer.

8. The method of claim 7 further comprising the step, following c), of:

d) passing the output signal of the mixer through a filter.

9. The method of claim 8 wherein step d) further comprises the step of:

substantially removing from the output signal of the mixer any spectral component having a frequency equal to the frequency of the second input to the mixer.

10. The method of claim 8 wherein step d) further comprises the step of:

substantially removing from the output signal of the mixer spectral components having frequencies that are outside of the band.

11. The method of claim 7 further comprising the step, after c), of:

d) substantially equalizing the amplitudes of the spectral components of the output signal of the mixer.

12. The method of claim 7 wherein said waveform is a continuing train of pulses.

13. The method of claim 7 wherein step a) further comprises the steps of:

generating a continuing train of timing pulses; and, applying the continuing train of timing pulses to a wave shaper.

14. The method of claim 7 wherein step a) further comprises the steps of:

generating a continuing train of timing pulses; and, applying the continuing train of timing pulses to a phase-locked oscillator.

15. Apparatus for generating a set of carriers that are equally spaced in frequency across a band and for simultaneously frequency modulating the carriers with an applied modulating signal, said apparatus comprising in combination:

first means for generating a waveform that has a spectrum which consists substantially of only odd integer multiples of a frequency equal to half the spacing between the carriers in the band;

second means for producing a frequency modulated signal in response to an applied modulating signal, the frequency modulated signal having a carrier frequency equal to the center frequency of the band;

a mixer having a first input terminal connected to said first means for receiving the waveform, having a second input terminal connected to said second means for receiving the frequency modulated signal, and having an output terminal, said mixer producing in response to the waveform and to the frequency modulated signal an output signal that includes the set of carriers each frequency modulated by the applied modulating signal, the output signal being presented on the output terminal of said mixer.

16. The apparatus of claim 15 further comprising in combination filter means connected to the output terminal of said mixer for removing unwanted spectral components from the output signal of said mixer.

17. The apparatus of claim 15 wherein said waveform is a continuing train of pulses.

18. The apparatus of claim 15 wherein said first means further comprise in combination:

a crystal-controlled oscillator generating a train of timing pulses; and, a wave shaper connected to said crystal-controlled oscillator and producing the waveform under control of the train of timing pulses.

19. The apparatus of claim 18 wherein said wave shaper further comprises a monostable multivibrator.

20. The apparatus of claim 18 wherein said wave shaper further comprises a phase-locked oscillator.

21. The apparatus of claim 15 wherein said second means further comprise in combination a voltage controlled crystal oscillator.

22. A method of generating a set of carriers that are equally spaced in frequency across a band and for simultaneously frequency modulating the carriers with an applied modulating signal, said method comprising the steps of:

a) generating a waveform that has a spectrum which consists substantially of only odd integer multiples of a frequency equal to half the spacing between the carriers in the band;

b) applying the waveform as a first input to a mixer; and, c) applying as a second input to the mixer a frequency modulated signal having a carrier frequency equal to the center frequency of the band, whereby the set of frequency modulated carriers is present in the output signal of the mixer.

23. The method of claim 22 further comprising the step, following c), of:

d) passing the output signal of the mixer through a filter.

24. The method of claim 23 wherein step d) further comprises the step of:

substantially removing from the output signal of the mixer any spectral component having a frequency equal to the carrier frequency of the second input to the mixer.

25. The method of claim 23 wherein step d) further comprises the step of:

substantially removing from the output signal of the mixer spectral components having frequencies that are outside of the band.

26. The method of claim 22 further comprising the step, after c), of:

d) substantially equalizing the amplitudes of the spectral components of the output signal of the mixer.

27. The method of claim 22 wherein said waveform is a continuing train of pulses.

28. The method of claim 22 wherein step a) further comprises the steps of:

generating a continuing train of timing pulses; and, applying the continuing train of timing pulses to a wave shaper.

29. The method of claim 22 wherein step a) further comprises the steps of:

generating a continuing train of timing pulses; and, applying the continuing train of timing pulses to a phase-locked oscillator.

* * * * *